US009590576B2

(12) United States Patent
Tatsumi

(10) Patent No.: US 9,590,576 B2
(45) Date of Patent: Mar. 7, 2017

(54) DIFFERENTIAL AMPLIFIER

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/849,160

(22) Filed: Sep. 9, 2015

(65) Prior Publication Data

US 2016/0072460 A1    Mar. 10, 2016

(30) Foreign Application Priority Data

Sep. 10, 2014   (JP) .................................. 2014-184395

(51) Int. Cl.
*H03F 3/45* (2006.01)

(52) U.S. Cl.
CPC ........... *H03F 3/45085* (2013.01); *H03F 3/45* (2013.01); *H03F 2203/45026* (2013.01); *H03F 2203/45352* (2013.01); *H03F 2203/45361* (2013.01); *H03F 2203/45612* (2013.01)

(58) Field of Classification Search
CPC ...... H03F 3/45; H03F 3/45076; H03F 1/3211; H03F 3/4508; H03F 3/45179; H03F 2003/45008
USPC ................................................. 330/252, 253
See application file for complete search history.

(56) References Cited

U.S. PATENT DOCUMENTS

| | | | |
|---|---|---|---|
| 5,227,681 A | 7/1993 | Koyama et al. | |
| 5,608,352 A * | 3/1997 | Itakura | H03F 1/3211 330/252 |
| 6,531,919 B1 * | 3/2003 | Carter | H03F 3/45291 330/252 |
| 6,778,013 B1 * | 8/2004 | Ali | H03F 1/32 330/252 |
| 7,076,226 B2 | 7/2006 | Bult et al. | |
| 7,271,652 B2 * | 9/2007 | Ozasa | H03F 3/211 330/252 |
| 2002/0089377 A1 * | 7/2002 | Hwang | H03F 3/45085 330/252 |
| 2011/0304394 A1 | 12/2011 | Bult et al. | |

FOREIGN PATENT DOCUMENTS

JP        2915440        4/1999
JP        H1-261905      12/2011

* cited by examiner

*Primary Examiner* — Khanh V Nguyen
(74) *Attorney, Agent, or Firm* — Smith, Gambrell & Russell, LLP.

(57) ABSTRACT

A differential amplifier is disclosed. The differential amplifier includes: a pair of input terminals externally receiving an input signal; a first differential pair including a first transistor, a second transistor, a first resistor, and a second resistor and configured to generate a first signal; a second differential pair including a third transistor, a fourth transistor, a third resistor, and a fourth resistor and configured to generate a second signal; a current source connected to the first, second, third, and fourth resistors and configured to provide a current to the first and second differential pairs; a pair of level shifters configured to generate a shifted signal from the input signal; and a pair of output terminals externally outputting an output signal containing the first and second signals, wherein the first and second transistors receive the input signal and the third and fourth transistors receive the shifted signal.

10 Claims, 10 Drawing Sheets

US 9,590,576 B2

DIFFERENTIAL AMPLIFIER

TECHNICAL FIELD

The present invention relates to a differential amplifier for driving an optical modulator in optical communication systems.

BACKGROUND

Digital modulation in optical communication systems needs a low-distortion amplifier according to a modulation system thereof. For example, U.S. Pat. No. 7,076,226 describes a differential amplifier with an improved linearity to obtain a low-distortion signal. As illustrated in FIG. 10, a differential amplifier 100 includes transistors 112, 113, 122, and 123. A pair of the transistors 112, 113 constitutes a differential pair 111 having non-linearity. Another pair of the transistors 122, 123 constitutes a differential pair 121 having non-linearity. The differential pair 121 and the differential pair 111 are connected in parallel to each other. The non-linearity of an output current Id11 output from the differential pair 111 and the non-linearity of an output current Id14 output from the differential pair 121 are canceled out by each other. Also, the non-linearity of an output current Id12 output from the differential pair 111 the non-linearity of an output current Id13 output from the differential pair 121 are canceled out by each other.

For example, technologies relating to a differential amplifier are described in Japanese Patent Application Laid-Open No. 1-261905, Japanese Patent No. 2915440, U.S. Pat. No. 5,227,681, and US Patent No. 2011/0304394. In optical transmission systems or the like constituting a core network, a superior low-distortion differential amplifier has been required for driving an optical modulator or the like, especially in a phase shift modulation system such as quadrature phase shift keying (QPSK).

SUMMARY

A recent rapid increase in a network capacity has been requiring more improved performance of an optical transmission apparatus and lower power consumption of the differential amplifier. In the differential amplifier 100, the output current Id11 of the differential pair 111 and the output current Id14 of the differential pair 121 are offset. The output current Id12 of the differential pair 111 and the output current Id13 of the differential pair 121 are offset. Therefore, an actual output current (Id11+Id14) becomes smaller than the output current Id11 output from the differential pair 111 is used. Another actual output current (Id12+Id13) becomes smaller than the output current Id12 output from the differential pair 111. Here, the absolute maximum of the output currents Id11 and Id12 become equal to a current Iss provided by a current source Iss. The absolute maximum of the output currents Id13 and Id14 become equal to a current Iss/n provided by a current source Iss/n. Therefore, respective amplitudes of the actual output currents (Id11+Id14) and (Td12+Id13) becomes equal to (Iss−Iss/n). On the other hand, a current consumed by the differential amplifier 100 becomes a sum (Iss+Iss/n) of currents consumed by the two current sources. Accordingly, an offsetting structure of the differential amplifier 100 increases the current consumption (Iss+Iss/n) but decreases the amplitude (Iss−Iss/n) of the output current, as compared with an old structure with only one differential pair 111 (current Iss).

In addition, the differential amplifier including only the differential pair 111 cannot provide a sufficient linearity against a wide range of a voltage input to the differential pair 111. For this reason, a differential amplifier achieving low power consumption and low distortion (brought by sufficient linearity) is required.

One of objects of one embodiment of the present invention is, for example, to provide a differential amplifier that can realize low power consumption and low distortion by expanding a range of linear operation.

A differential amplifier according to one embodiment of the present invention is a differential amplifier for generating a differential output current from a differential input voltage. The differential amplifier includes a pair of input terminals, a first differential pair, a pair of level shifters, a second differential pair, a current source, and a pair of output terminals. The pair of input terminals is configured to externally receive the differential input voltage. The first differential pair includes a first transistor, a second transistor, a first resistor, and a second resistor. The first transistor and the second transistor each have a first current terminal connected to each other through the first resistor and the second resistor connected in series to the first resistor. The first differential pair is configured to generate a first differential signal in response to the differential input voltage. The pair of level shifters is configured to generate a shifted differential voltage shifted from the differential input voltage. The second differential pair includes a third transistor, a fourth transistor, a third resistor, and a fourth resistor. The third transistor and the fourth transistor each have a first current terminal thereof connected to each other through the third resistor and the fourth resistor connected in series to the third resistor. The second differential pair is configured to generate a second differential signal in response to the shifted differential voltage. The current source is configured to provide a constant current to the first and second differential pairs. The pair of output terminals is configured to externally output the differential output current containing the first differential signal and the second differential signal.

According to one embodiment of the present invention, a differential amplifier that can realize low power consumption and low distortion against a wide range of a voltage input can be provided.

DETAILED DESCRIPTION

Figure 1:
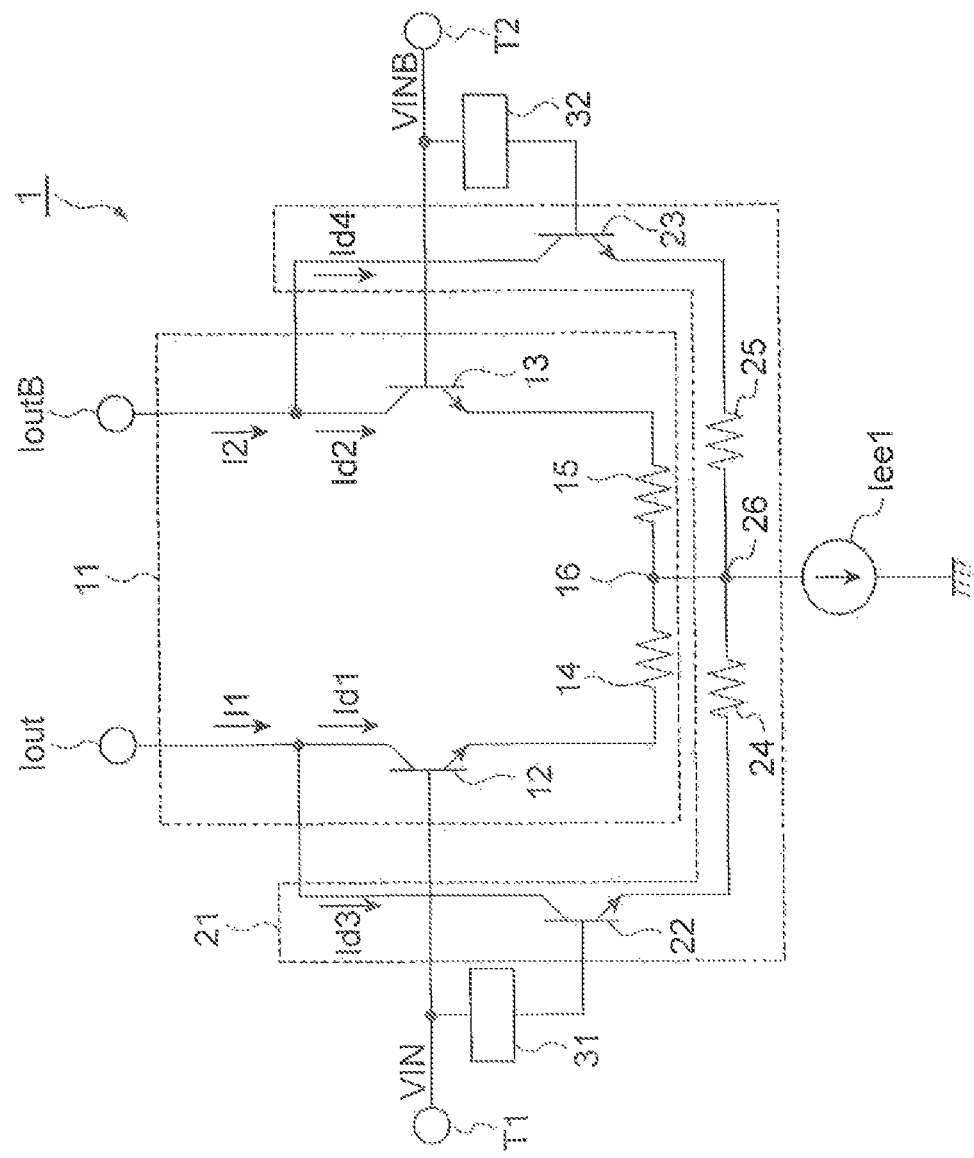
FIG. 1 is a circuit diagram of a differential amplifier according to a first embodiment of the present invention.

Hereinafter, preferred embodiments of the present invention will be described in detail with reference to the accompanying drawings. In the following description, the same reference numerals are used for the same elements or elements having the same functions and overlapped explanation is omitted.

(First Embodiment)

FIG. 1 is a circuit diagram of a differential amplifier according to a first embodiment of the present invention. As illustrated in FIG. 1, a differential amplifier 1 includes a first differential pair 11, a second differential pair 21, a first voltage shifter (first level shifter) 31, a second voltage shifter (second level shifter) 32, and a current source Iee1. The first differential pair 11 and the second differential pair 21 are connected to the current source Iee1. A positive-phase input voltage VIN (hereafter, voltage VIN) and a negative-phase input voltage VINB (hereafter, voltage VINB) are input to each of the first differential pair 11 and the second differential pair 21. Specifically, the voltage VIN is input to the first differential pair 11 and the second differential pair 21 via a terminal T1. The voltage VINB is input to the first differential pair 11 and the second differential pair 21 via a terminal T2. The voltages VIN and VINB are high frequency complementary signals having phases opposite to each other. A pair of high frequency complementary signals is handled as one differential input signal. In the present specification, "connection" is not limited to direct connection and includes electrical connection and indirect connection.

The first differential pair 11 includes a first transistor 12, a second transistor 13, a first resistor 14, and a second resistor 15. The first transistor 12 and the second transistor 13 are NPN-type bipolar transistors, for example. Hereinafter, bases of the first transistor 12 and the second transistor 13 are set as control terminals. Collector and emitter in each of the first transistor 12 and the second transistor 13 are set as a pair of current terminals.

The control terminal of the first transistor 12 is connected to the terminal T1. One current terminal of the first transistor 12 is connected to one current terminal of the second transistor 13 via the first resistor 14 and the second resistor 15. The other current terminal of the first transistor 12 is connected to a positive-phase output current terminal Iout (hereafter, terminal Iout). In addition, the control terminal of the second transistor 13 is connected to the terminal T2. The other current terminal of the second transistor 13 is connected to a negative-phase output current terminal IoutB (hereafter, terminal IoutB). The current source Iee1 is connected to a first connecting point 16 provided between the first resistor 14 and the second resistor 15.

In the first differential pair 11, respective parameters (for example, a ratio (hereinafter, referred to as W/L) of a channel length L and a channel width W, a threshold voltage, and a ratio of on-state to off-state) of the first transistor 12 and the second transistor 13 are equal to each other. In addition, respective resistances of the first resistor 14 and the second resistor 15 are equal to each other.

The second differential pair 21 includes a third transistor 22, a fourth transistor 23, a third resistor 24, and a fourth resistor 25. The third transistor 22 and the fourth transistor 23 are NPN-type bipolar transistors, for example. Hereinafter, bases of the third transistor 22 and the fourth transistor 23 are set as control terminals. Collector and emitter in each of the third transistor 22 and the fourth transistor 23 are set as a pair of current terminals.

The control terminal of the third transistor 22 is connected to the terminal T1 via the first voltage shifter 31. One current terminal of the third transistor 22 is connected to one current terminal of the fourth transistor 23 via the third resistor 24 and the fourth resistor 25. The other current terminal of the third transistor 22 is connected to the terminal Iout. In addition, the control terminal of the fourth transistor 23 is connected to the terminal T2 via the second voltage shifter 32. The other current terminal of the fourth transistor 23 is connected to the terminal IoutB. The current source Iee1 is connected to a second connecting point 26 provided between the third resistor 24 and the fourth resistor 25. Therefore, the current source Iee1 is connected to the first connecting point 16 in the first differential pair 11 and the second connecting point 26 in the second differential pair 21.

In the second differential pair 21, respective parameters (for example, W/L, a threshold voltage, and a ratio of on-state to off-state) of the third transistor 22 and the fourth transistor 23 are equal to each other. In addition, respective resistances of the third resistor 24 and the fourth resistor 25 are equal to each other.

The W/L of the first transistor 12 in the first differential pair 11 and the W/L of the third transistor 22 in the second differential pair 21 are different from each other. For example, a ratio (the W/L of the first transistor 12):(the W/L of the third transistor 22) is about 5:1. In this case, the respective channel lengths of the first transistor 12 and the third transistor 22 may be equal to each other, and the channel widths thereof may be different from each other. Alternatively, the respective channel lengths of the first transistor 12 and the third transistor 22 may be different from each other, and the channel widths thereof may be equal to each other. The threshold voltage and the ratio of on-state to off-state of the first transistor 12 may be equal to the threshold voltage and the ratio of on-state to off-state of the third transistor 22. Likewise, the W/L of the second transistor 13 in the first differential pair 11 and the W/L of the fourth transistor 23 in the second differential pair 21 are different from each other.

The first voltage shifter 31 is a circuit that shifts an input voltage by a first voltage and outputs a shifted voltage from the input voltage. Here, the word "shift" means increasing or decreasing an input voltage by a predetermined value. An input part of the first voltage shifter 31 is connected to the terminal T1 and an output part of the first voltage shifter 31 is connected to the control terminal of the third transistor 22. The first voltage shifter 31 may be a variable voltage source, for example. In the embodiment, the first voltage shifter 31 outputs a voltage shifted from the voltage VIN by the first voltage to the control terminal of the third transistor 22.

The second voltage shifter 32 is a circuit that shifts an input voltage by the first voltage and outputs a shifted voltage from the input voltage. An input part of the second voltage shifter 32 is connected to the terminal T2 and an output part of the second voltage shifter 32 is connected to the control terminal of the fourth transistor 23. The second voltage shifter 32 may be a variable voltage source, for example. In the embodiment, the second voltage shifter 32 outputs a voltage shifted from the voltage VINB by the first voltage to the control terminal of the fourth transistor 23.

Figure 2:
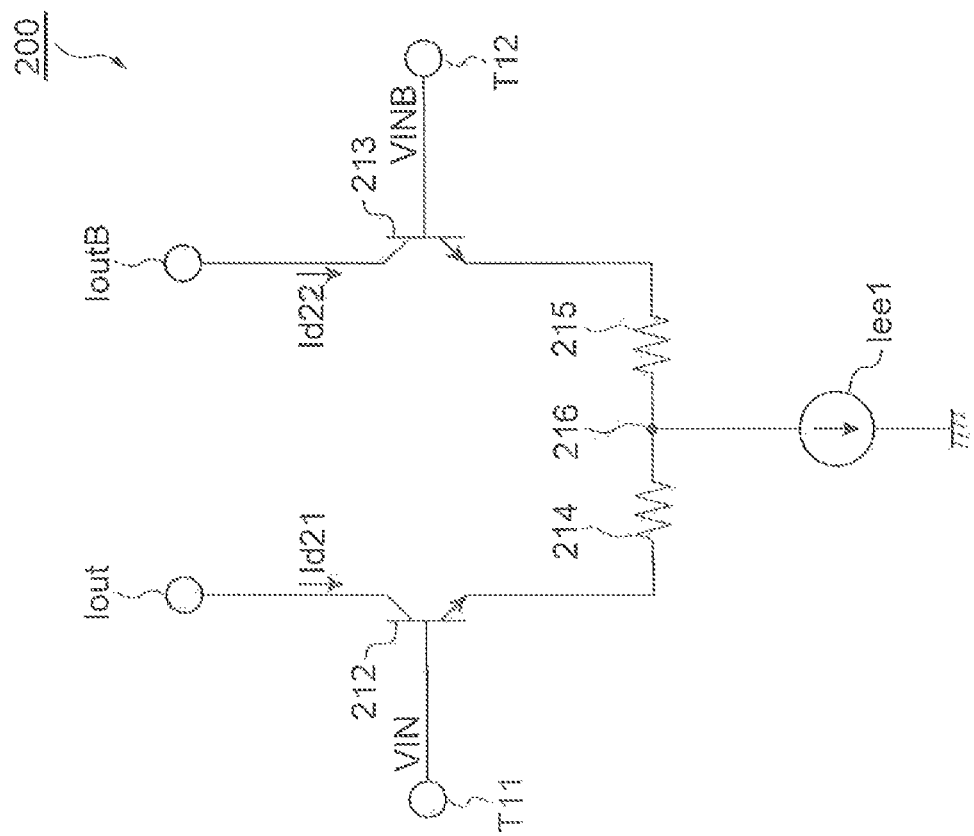
FIG. 2 is a circuit diagram of a differential amplifier according to a comparative example.

Next, a function and an advantage of the differential amplifier 1 illustrated in FIG. 1 will be described. First, a differential amplifier for comparison with the differential amplifier 1 will be described. FIG. 2 is a circuit diagram of a differential amplifier according to a comparative example. A differential amplifier 200 illustrated in FIG. 2 includes a first transistor 212, a second transistor 213, a first resistor 214, a second resistor 215, and a current source Iee1. A control terminal of the first transistor 212 is connected to a terminal T11 to receive the voltage VIN. A control terminal of the second transistor 213 is connected to a terminal T12 to receive the voltage VINB. One current terminal of the first transistor 212 is connected to one current terminal of the second transistor 213 via a first resistor 214 and a second resistor 215. The other current terminal of the first transistor 212 is connected to the terminal Iout and the other current terminal of the second transistor 213 is connected to the terminal IoutB. The current source Iee1 is connected to a connecting point 216 provided between the first resistor 214 and the second resistor 215.

Respective parameters of the first transistor 212 and the second transistor 213 are equal to the respective parameters of the first transistor 12 and the second transistor 13 in the differential amplifier 1.

Next, actions of the differential amplifier 200 will be described. As illustrated in FIG. 2, to the control terminal of the first transistor 212 receives the voltage VIN from the terminal T11. Concurrently, the control terminal of the second transistor 213 receives the voltage VINB from the terminal T12. The current source Iee1 provides an output current Id21 and an output current Id22. The output current Id21 flows from the terminal Iout to the current source Iee1 through the pair of current terminals of the first transistor 212 and the first resistor 214. The output current Id22 flows from the terminal IoutB to the current source Iee1 through the pair of current terminals of the second transistor 213 and the resistor 215. The output current Id21 is regulated by the first transistor 212. The output current Id22 is regulated by the second transistor 213. The total of the output currents Id21 and Id22 is equal to a constant current Iee1 provided by the current source Iee1. The linearity of the differential amplifier 200 depends on linearities of the first transistor 212 and the second transistor 213.

Next, actions of the differential amplifier 1 according to this embodiment of the present invention will be described. As illustrated in FIG. 1, the control terminal of the first transistor 12 in the first differential pair 11 receives the voltage VIN from the terminal T1 as one of a pair of complementary input voltages constituting a differential input voltage. In addition, the control terminal of the third transistor 22 in the second differential pair 21 receives a voltage shifted from the voltage VIN by the first voltage through the first voltage shifter 31. The current source Iee1 provides the output currents Id1 and Id3. The output current Id1 flows from the terminal Iout to the current source Iee1 through the pair of current terminals of the first transistor 12 and the first resistor 14. The output current Id3 flows from the terminal Iout to the current source Iee1 through the pair of current terminals of the third transistor 22 and the third resistor 24. The output current Id1 is regulated by the first transistor 12 and the output current Id3 is regulated by the third transistor 22.

Both the output currents Id1, Id3 are controlled by the same positive-phase input voltage VIN. The output currents Id1, Id3 have the same phase of current signal. Therefore, the output currents Id1, Id3 are added to each other to be output to the terminal Iout. That is, a positive-phase output current I1 (hereafter, current I1) output by the differential amplifier 1 includes the output currents Id1, Id3. The current I1 is output to the terminal Iout. Here, a voltage input to the control terminal of the third transistor 22 is shifted from a voltage input to the control terminal of the first transistor 12 by the first voltage. Thereby, a region of a differential input voltage to turn on the first transistor 22 and output the output current Id3 is shifted from a region of a differential input voltage to turn on the third transistor 22 and output the output current Id1.

Likewise, the control terminal of the second transistor 13 in the first differential pair 11 receives the voltage VINB from the terminal T2 as the other of a pair of complementary input voltages constituting the differential input voltage. In addition, the control terminal of the fourth transistor 23 in the second differential pair 21 receives a voltage shifted from the voltage VINB by the first voltage through the second voltage shifter 32. The current source Iee1 provides the output currents Id2, Id4. The output current Id2 flows from the terminal IoutB to the current source Iee1 through the pair of current terminals of the second transistor 13 and the second resistor 15. The output current Id4 flows from the terminal IoutB through the pair of current terminals of the fourth transistor 23 and the fourth resistor 25. The output current Id2 is regulated by the second transistor 13 and the output current Id4 is regulated by the fourth transistor 23.

Both the output currents Id2, Id4 are controlled by the same negative-phase input voltage VINB. The output currents Id1, Id3 have the same phases of current signal. The output currents Id2, Id4 have the same phases of current signal. Therefore, the output currents Id2, Id4 are added to each other to be output to the terminal IoutB. That is, a negative-phase output current I2 (hereafter, current I2) output by the differential amplifier 1 includes the output currents Id2 and Id4. The current I2 is output to the terminal IoutB. Here, a voltage input to the control terminal of the fourth transistor 23 is shifted from a voltage input to the control terminal of the second transistor 13 by the first voltage. Thereby, a region of a differential input voltage to turn on the second transistor 13 and output the output current Id2 is shifted from a region of a differential input voltage to turn on the fourth transistor 23 and output the output current Id4. Note that the currents I1, I2 are complementary output currents constituting a differential output current.

The complementary voltages VIN VINB may be exchanged with each other without affecting the circuit operation of the differential amplifier 1. For example, the voltage VINB may be input to the first differential pair 11 and the second differential pair 21 through the terminal T1. The voltage VIN may be input to the first differential pair 11 and the second differential pair 21 through the terminal T2. In this case, the control terminal of the second transistor 13 receives the voltage VIN. The control terminal of the fourth transistor 23 receives a voltage shifted from the voltage VIN by the first voltage through the second voltage shifter. Likewise, the control terminal of the first transistor 12 receives the voltage VINB. The control terminal of the third transistor 22 receives a voltage shifted from the voltage VINB by the first voltage through the first voltage shifter. Accordingly, the polarity of the differential input signal can be easily inverted.

Figure 3:
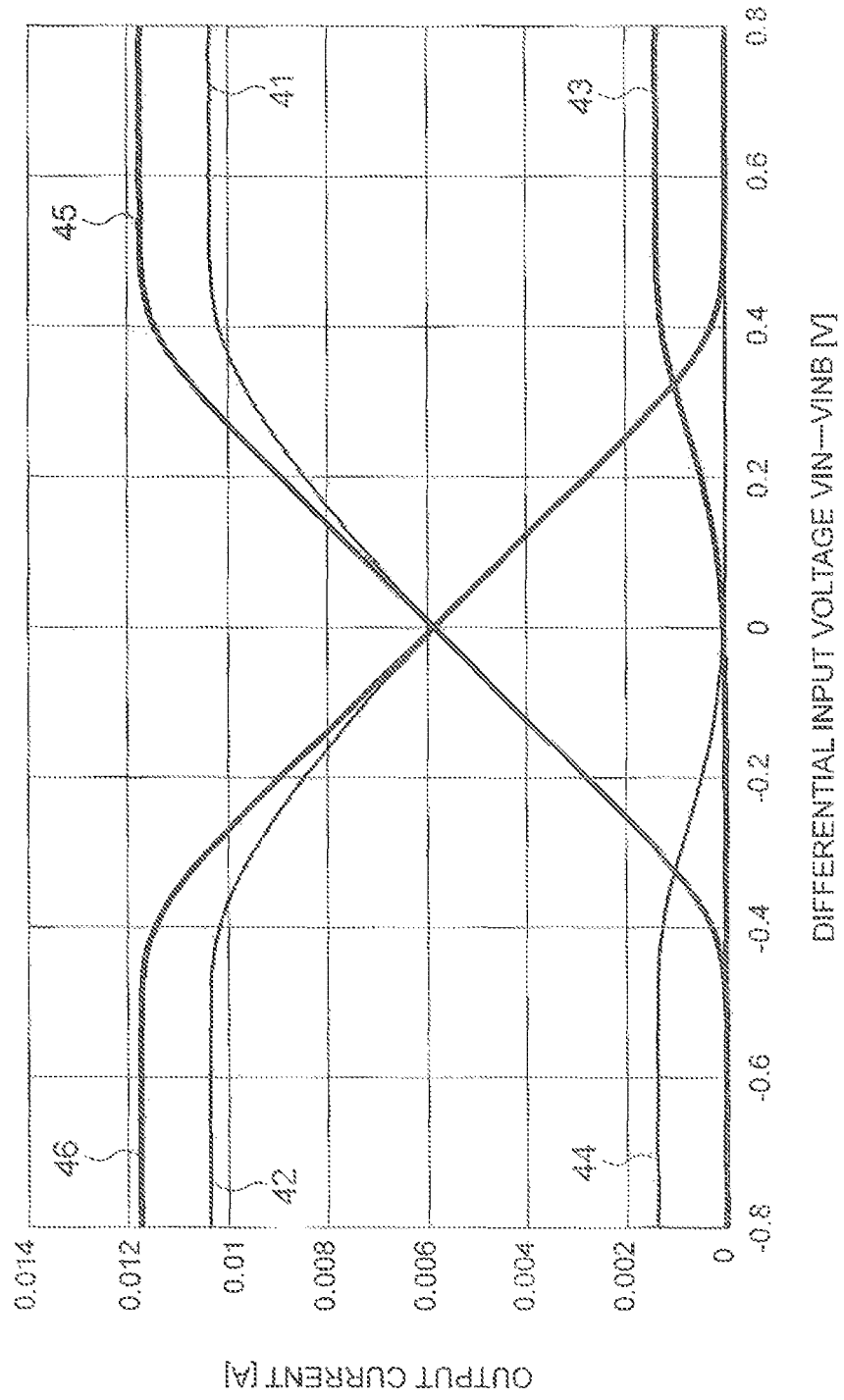
FIG. 3 is a diagram illustrating a relationship between a differential input voltage and an output current of a differential amplifier according to the first embodiment.

FIG. 3 is a diagram illustrating a relationship between the differential input voltage VIN−VINB and the respective output currents Id1 to Id4 of the first to fourth transistors in the differential amplifier 1. In FIG. 3, a horizontal axis shows a difference between the voltages VIN, VINB, i.e., differential input voltage VIN−VINB. A vertical axis shows an output current of the differential amplifier 1. A curve 41 corresponds to the output current Id1. A curve 42 corresponds to the output current Id2. A curve 43 corresponds to the output current Id3. A curve 44 corresponds to the output current Id4. A curve 45 corresponds to the positive-phase output current I1 obtained by summing up the curve 41 and the curve 43. A curve 46 corresponds to the negative-phase output current I2 obtained by summing up the curve 42 and the curve 44. When the differential input voltage VIN−VINB is set to 0 V, the first voltage for the first voltage shifter 31 and the second voltage shifter 32 is determined so that the output currents Id1 and Id2 have the same values and the output currents Id3 and Id4 become nearly 0. That is, when the voltages VIN, VINB are set to equal to each other, the first transistor 12 and the second transistor 13 are turned on and the third transistor 22 and the fourth transistor 23 are turned off.

As illustrated in FIG. 3, the differential input voltage VIN−VINB larger than 0 V increases the output current Id1 (curve 41), decreases the output current Id2 (curve 42), turns on the third transistor 22 to increase the output current Id3 (curve 43). Because an OFF state of the fourth transistor 23 (curve 44) is maintained, the output current Id4 stays at nearly 0. In this case, the current I1 output from the terminal Iout includes the output currents Id1, Id3. The differential input voltage VIN−VINB smaller than 0 V increases the output current Id2 (curve 42), decreases the output current Id1 (curve 41), turn on the fourth transistor 23 and output the output current Id4 (curve 44). Because an OFF state of the third transistor 22 is maintained, the output current Id3 (curve 43) stays at nearly 0. In this case, the current I2 output from the terminal IoutB includes the output currents Id2, Id4.

A decrease of gain of the differential amplifier 1 at a large absolute value of the differential input voltage VIN−VINB causes non-linearity in amplification of the differential amplifier 1. As illustrated in FIG. 3, in the differential amplifier 1, when the absolute value of the differential input signal VIN−VINB increases and exceeds a predetermined voltage (first voltage), the third transistor 22 or the fourth transistor 23 is turned on. Compensating the decreased gain restrains the non-linearity of the differential amplifier 1.

Figure 4:
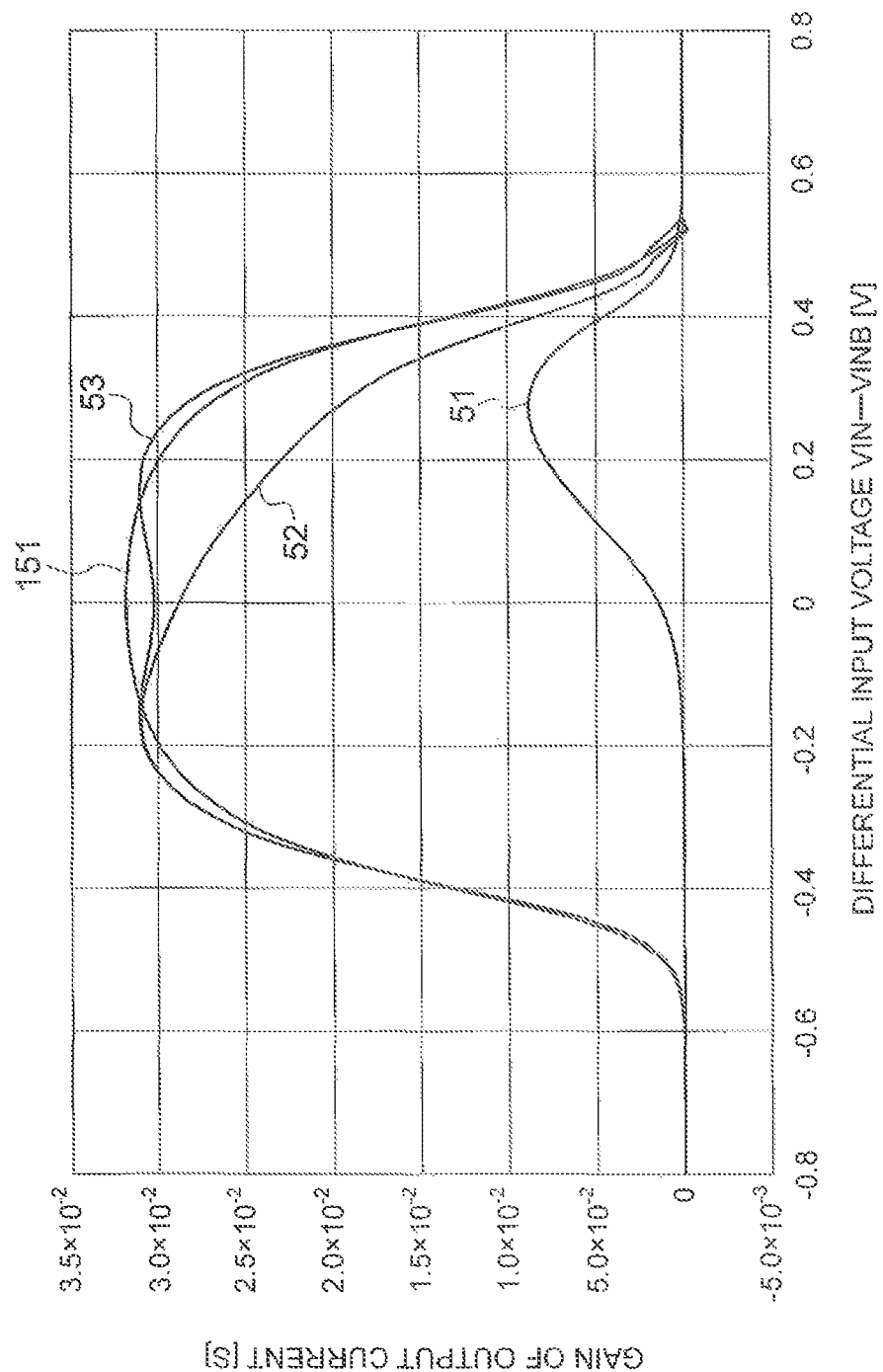
FIG. 4 is a diagram illustrating gain of an output current for a differential input voltage.

FIG. 4 is a diagram illustrating gains of the current I1 (refer to FIG. 1) and the output current Id21 (refer to FIG. 2) for the differential input voltage VIN−VINB. Respective parameters of the first transistor 212 in the differential amplifier 200 are equal to respective parameters of the first transistor 12 in the differential amplifier 1. Respective parameters of the second transistor 213 in the differential amplifier 200 are equal to respective parameters of the second transistor 13 in the differential amplifier 1. The gain of the output current is calculated by differentiating each output current with the differential input voltage VIN−VINB. In FIG. 4, a horizontal axis shows the differential input voltage VIN−VINB and a vertical axis shows gains of the positive-phase output current I1 and the output current Id21 output from the terminal Iout of the differential amplifier 1 or the differential amplifier 200. A curve 51 shows a gain of the output current Id3 for the differential input voltage VIN−VINB. A curve 52 shows a gain of a current obtained by summing up the output currents Id1, Id4. A curve 53 is obtained by summing up the curve 51 and the curve 52. A curve 151 shows gain of the output current Id21 for the differential input voltage VIN−VINB. In the differential amplifier 1, as flatness of gain is generally related to linearity, a wide range in which the gain of the output current hardly changes for the differential input voltage VIN−VINB brings a wide range of linearity.

As illustrated in FIG. 4, in the curve 151, the gain of the output current Id21 of the differential amplifier 200 according to the comparative example has a peak value when the differential input voltage VIN−VINB is 0 V. In addition, the gain of the output current Id21 decreases from the peak value, when the differential input voltage VIN−VINB increases to a positive side or decreases to a negative side. When the gain of the output current Id21 is nearly 0, the output current Id21 becomes nearly 0 or the first transistor 212 is saturated. For example, when a flatness of the gain is defines as a decrease from a peak value within about 3%, the flatness is satisfied for the curve 151 in the range of the differential input voltage VIN−VINB from −0.15 V to 0.15 V.

On the other hand, a point at which the curve 51 starts to rise and a point at which the curve 52 starts to rise are different from each other, when the differential input voltage VIN−VINB increases from a negative side thereof a positive side thereof. This is because the voltage input to the control terminal of the third transistor 22 is shifted from the voltage VIN input to the control terminal of the first transistor 12 by the first voltage. As shown by the curve 53, a range to satisfy the flatness becomes wide by summing up the curve 51 and the curve 52, as compared with the curve 151. Specifically, we can see that the range of the differential input voltage VIN−VINB for the curve 53 to satisfy the flatness (a decrease from a peak value within about 3%) is from −0.25 V to 0.25 V. That is, the range of linearity of the differential amplifier 1 according to the first embodiment becomes about 1.7 times wider than the range of linearity of the differential amplifier 200 according to the comparative example.

Figure 10:
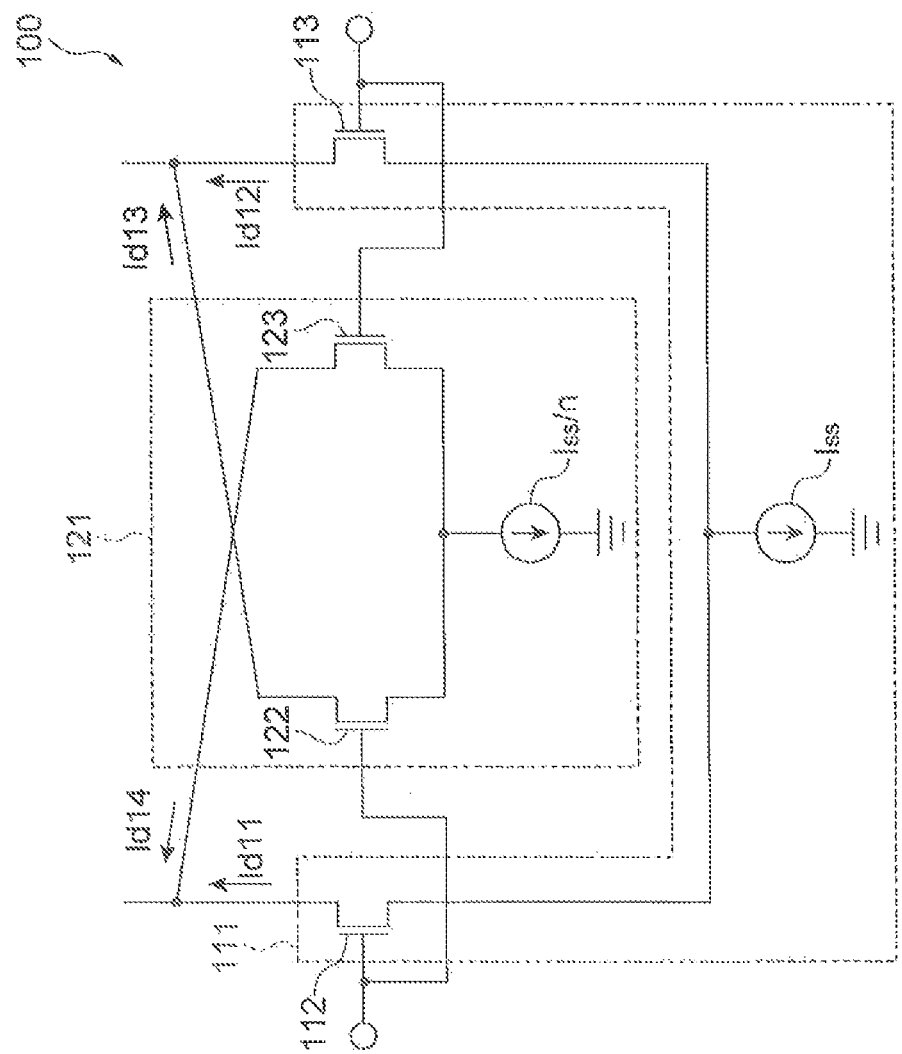
FIG. 10 is an example of a circuit diagram of a differential amplifier according to a related art.

As described above, on the basis of the differential amplifier 1 according to the first embodiment of the present invention, a sum of the positive-phase output current I1 and the negative-phase output current I2 is equal to a current provided by the current source Iee1 connected to the first differential pair 11 and the second differential pair 21. That is, the positive-phase output current I1 and the negative-phase output current I2 has the same phase of current signal and eliminates the loss by offset of the two output currents each having opposite phase to each other in the differential amplifier 100 illustrated in FIG. 10. As a result, downsizing and low power consumption are realized without deteriorating the amplitude of current signal (output current). In addition, the second differential pair 21 receives a control voltage shifted by the first voltage from the control voltage that the first differential pair 11 receives. Thereby, a region in which the first transistor 12 of the first differential pair 11 is turned on and output the output current Id1 can be shifted from a region in which the third transistor 22 of the second differential pair 21 is turned on and output the output current Id3. Likewise, a region in which the second transistor 13 of the first differential pair 11 is turned on and output the output current Id2 can be shifted from a region in which the fourth transistor 23 of the second differential pair 21 is turned on and output the output current Id4. In addition, the output current Id1 of the first transistor 12 and the output current Id3 of the third transistor 22 have the same phase of current signal. The output current Id2 of the second transistor 13 and the output current Id4 of the fourth transistor 23 have the same phase of current signal. Therefore, the gain of the output current Id3 is added to the gain of the positive-phase output current I1 for the differential input voltage VIN−VINB, in a region in which the gain of the output current Id1 decreases. In addition, the gain of the output current Id4 is added to the gain of the negative-phase output current I2 for the differential input voltage VIN−VINB, in a region in which the gain of the output current Id2 decreases. By this operation, the range of linearity of the differential amplifier 1 can be expanded.

The differential amplifier 1 includes the first voltage shifter 31 and the second voltage shifter 32 that shift the input voltage by the first voltage and output the shifted voltage from the input voltage. The voltage VIN may be input to the control terminal of the third transistor 22 through the first voltage shifter 31, and the voltage VINB may be input to the control terminal of the fourth transistor 23 through the second voltage shifter 32. As such, the first voltage can be easily adjusted using the first voltage shifter 31 and the second voltage shifter 32.

(First Modification)

Figure 5:
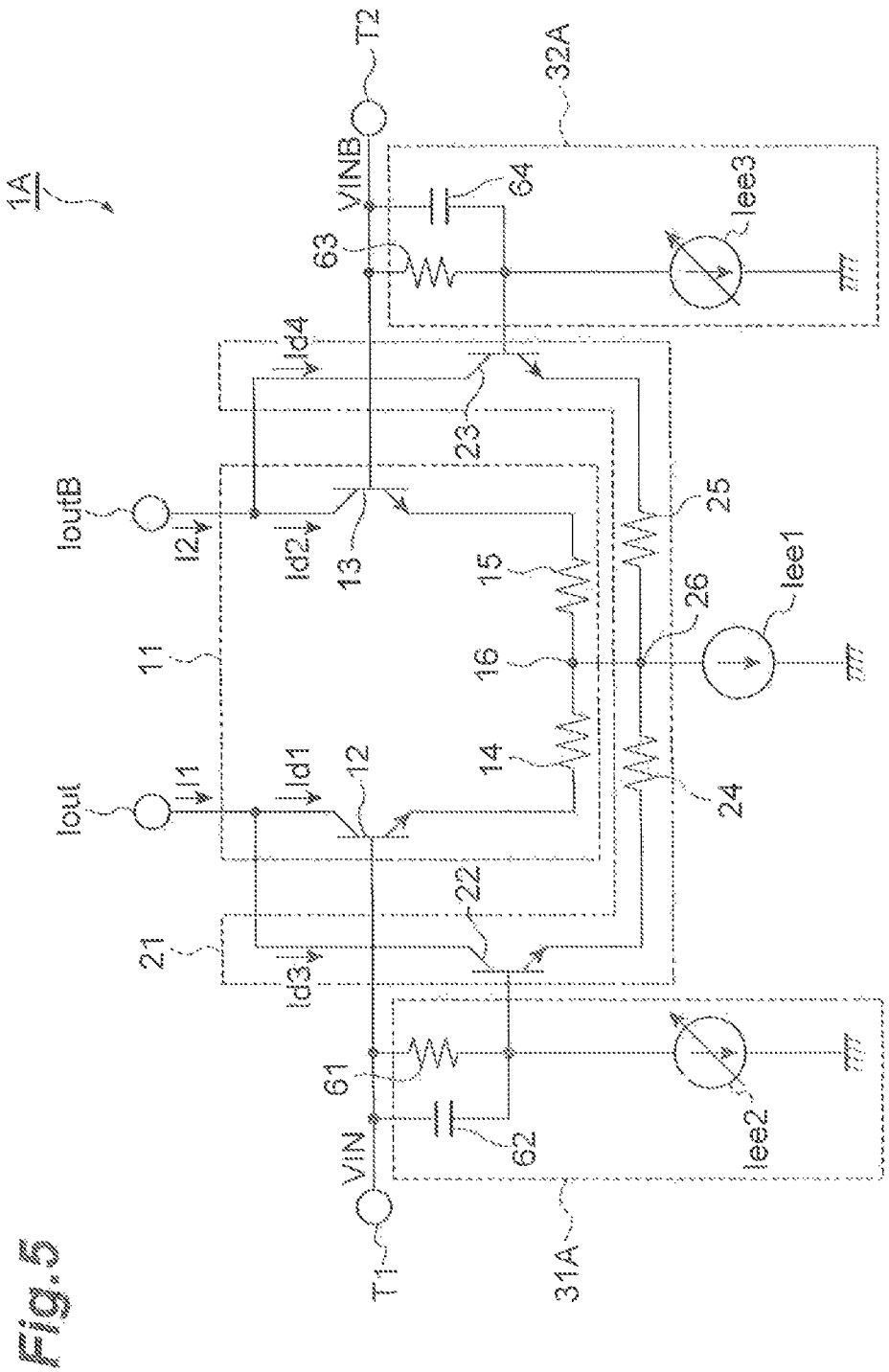
FIG. 5 is a circuit diagram of a differential amplifier according to a first modification.

FIG. 5 is a circuit diagram of a differential amplifier according to a first modification of the embodiment of the present invention. A differential amplifier 1A includes a first voltage shifter 31A and a second voltage shifter 32A. The first voltage shifter 31A includes a first shifting resistor 61, a first capacitor 62, and a current source (shifting current source) Iee2. The second voltage shifter 32A includes a second shifting resistor 63, a second capacitor 64, and a current source (shifting current source) Iee3.

In the first voltage shifter 31A, the first shifting resistor 61 is connected between the terminal T1 and the control terminal of the third transistor 22. The first capacitor 62 is connected between the terminal T1 the control terminal of the third transistor 22, in parallel with the first shifting resistor. The current source Iee2 is a variable current source that is connected to the first shifting resistor 61 to generate a current flowing in the first shifting resistor 61. The current source Iee2 may be connected to one terminal of the first shifting resistor 61 that is connected to the terminal T1 and may be alternatively connected to the other terminal of the first shifting resistor 61 that is connected to the control terminal of the third transistor 22. For example, when the current source Iee2 is connected to the other terminal of the first shifting resistor 61, the current source Iee2 generates a current, such that a voltage potential of the other terminal of the first shifting resistor 61 becomes lower than a voltage potential of one terminal of the first shifting resistor 61.

In the second voltage shifter 32A, the second shifting resistor 63 is connected between the terminal T2 the control terminal of the fourth transistor 23. The second capacitor 64 is connected between the terminal T2 and the control terminal of the fourth transistor 23, in parallel with the second shifting resistor. The current source Iee3 is a variable current source that is connected to the second shifting resistor 63 to generate a current flowing in the second shifting resistor 63. The current source Iee3 may be connected to one terminal of the second shifting resistor 63 that is connected to the terminal T2 and may be alternatively connected to the other terminal of the second shifting resistor 63 that is connected to the control terminal of the third transistor 23. For example, when the current source Iee3 is connected to the other terminal of the second shifting resistor 63, the current source Iee3 generates a current, such that a voltage potential of the other terminal of the second shifting resistor 63 becomes lower than a voltage potential of one terminal of the second shifting resistor 63.

The first shifting resistor 61 and the second shifting resistor 63 have the same resistance. The first capacitor 62 and the second capacitor 64 have the same capacitance, for example, 100 fF to 1 pF. Respective currents output from the current sources Iee2, Iee3 are equal to each other.

In the differential amplifier 1A, the control terminal of the third transistor 22 receives a voltage (an average voltage) lowered from an average of the voltage VIN (an average of the voltage VIN) by a voltage drop of the first shifting resistor 61. The first voltage corresponds to the voltage drop determined by a product of the resistance of the first shifting resistor 61 and the current provided by the current source Iee2. In addition, the control terminal of the fourth transistor 23 receives a voltage (an average voltage) lowered from the voltage VINB (an average of the voltage VINB) by the first voltage determined by a product of resistance of the second shifting resistor 63 and current provided by the current source Iee3. In addition, the first capacitor 62 and the second capacitor 64 each reduce input impedance of the voltages VIN, VINB at high frequency switching.

In addition, it is considered that the product of the resistance of the first shifting resistor 61 and the current of the current source Iee2 and the product of the resistance of the second shifting resistor 63 and the current of the current source Iee3 are equalized to each other so as to match the first voltages of the first voltage shifter 31A with the first voltage of the second voltage shifter 32A. Here, because the resistance of the first 61 and the resistance of the second 63 affect frequency characteristics of the first voltage shifter 31A and the second voltage shifter 32A respectively, these resistances may be equal to each other to prevent unsymmetrical actions of the differential amplifier 1A. In addition, the respective currents of the current sources Iee2, Iee3 may be equalized, from the view point of symmetry in an operation of the differential amplifier 1A.

The differential amplifier 1A according to the first modification described above achieves the same advantage as the first embodiment. The first voltage of the first voltage shifter 31A and the second voltage shifter 32A can be determined accurately. In addition, current consumption of the current source Iee2 used for the first voltage shifter 31A and the current source Iee3 used for the second voltage shifter 32A can be decreased greatly as compared with the current consumption of the current source Iee1. Specifically, even though the output currents of the current sources Iee2 and Iee3 are set to about 1/10 of the output current of the current source Iee1, the first voltage shifter 31A and the second voltage shifter 32A can work normally. Therefore, high performance can be realized while power consumption is suppressed from increasing.

(Second Modification)

Figure 6:
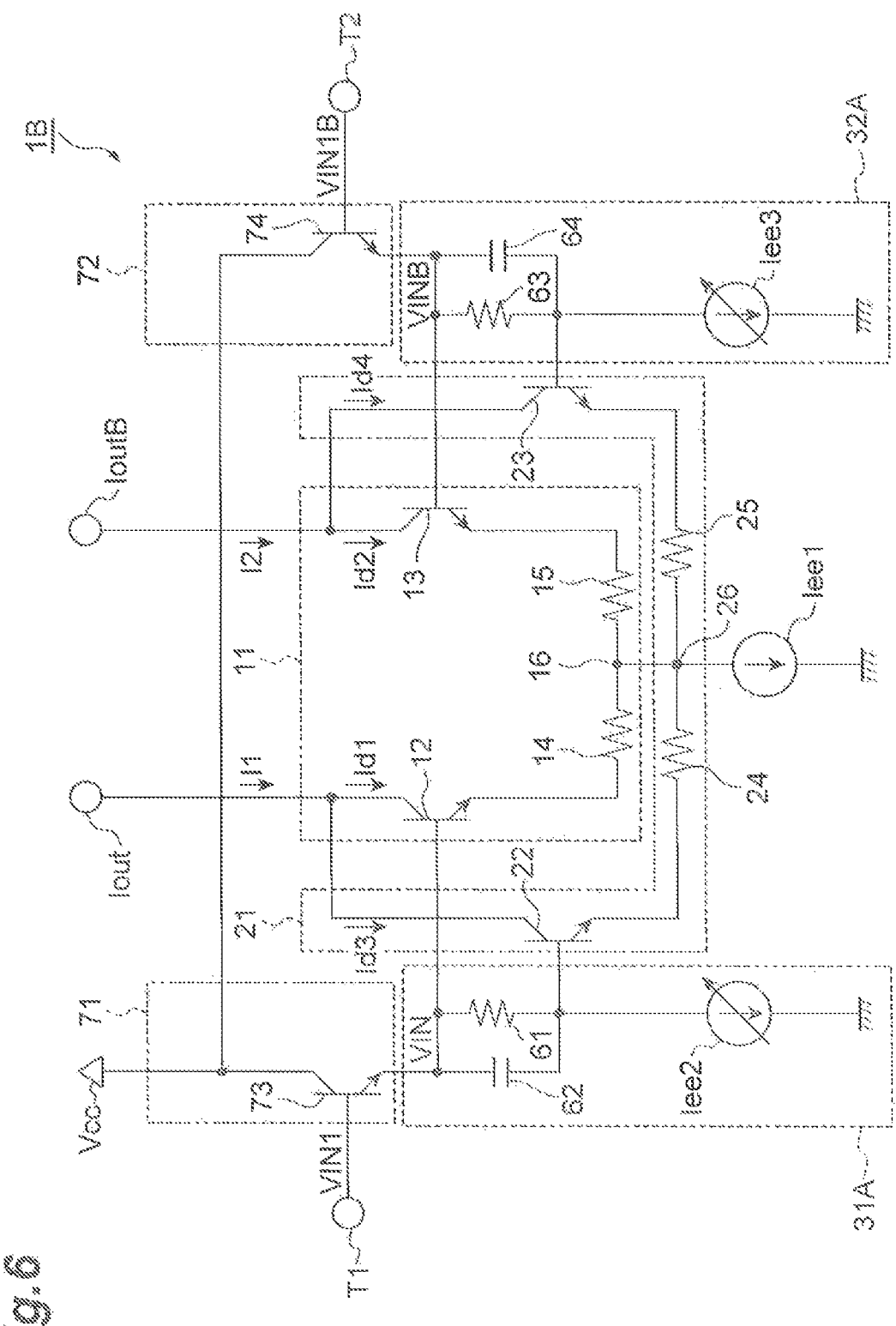
FIG. 6 is a circuit diagram of a differential amplifier according to a second modification.

FIG. 6 is a circuit diagram of a differential amplifier according to a second modification of the embodiment of the present invention. A differential amplifier 1B includes a first emitter follower 71 connected to the first voltage shifter 31A and a second emitter follower 72 connected to the second voltage shifter 32A, in addition to the structure of the differential amplifier 1A.

The first emitter follower 71 includes a fifth transistor 73. A control terminal (base) of the fifth transistor 73 is connected to the terminal T1. One current terminal (emitter) of the fifth transistor 73 is connected to the control terminal (base) of the first transistor 12 and is connected to the control terminal (base) of the third transistor 22 through the first voltage shifter 31A. The other current terminal (collector) of the fifth transistor 73 is connected to a constant voltage line Vcc having a potential of power supply.

The second emitter follower 72 includes a sixth transistor 74. A control terminal (base) of the sixth transistor 74 is connected to the terminal T2. One current terminal (emitter) of the sixth transistor 74 is connected to the control terminal (base) of the third transistor 22 and is connected to the control terminal (base) of the fourth transistor 23 through the second voltage shifter 32A. The other current terminal (collector) of the sixth transistor 74 is connected to the constant voltage line Vcc.

In the differential amplifier 1B, a positive-phase input voltage VIN1 is input to the first emitter follower 71 through the terminal T1. In addition, the first emitter follower 71 outputs a positive-phase input voltage VIN (corresponding to a positive-phase input voltage VIN of FIG. 5) to the control terminal of the first transistor 12 and the first voltage shifter 31A according to the positive-phase input voltage VIN1. Likewise, a negative-phase input voltage VIN1B is input to the second emitter follower 72 through the terminal T2. In addition, the second emitter follower 72 outputs a negative-phase input voltage VINB (corresponding to a negative-phase input voltage VINB of FIG. 5) to the control terminal of the third transistor 22 and the second voltage shifter 32A according to the negative-phase input voltage VIN1B. The positive-phase input voltage VIN1 and the negative-phase input voltage VIN1B are complementary signals each having opposite phase to each other. A voltage input to the terminal T1 may be defined as the positive-phase input voltage VIN and a voltage input to the terminal T2 may be defined as the negative-phase input voltage VINB just for renaming without changing the circuit structure.

The differential amplifier 1B according to the second modification described above achieves the same advantage as the first modification. Because the first differential pair 11 and the second differential pair 21 receives respective suitable voltages output by the first emitter follower 71 and the second emitter follower 72, the first differential pair 11 and the second differential pair 21 can work normally at a high speed. By setting a voltage of the constant voltage line Vcc to about ½ of a voltage of a power supply providing an output current, high performance can be realized while power consumption is suppressed from increasing.

(Third Modification)

Figure 7:
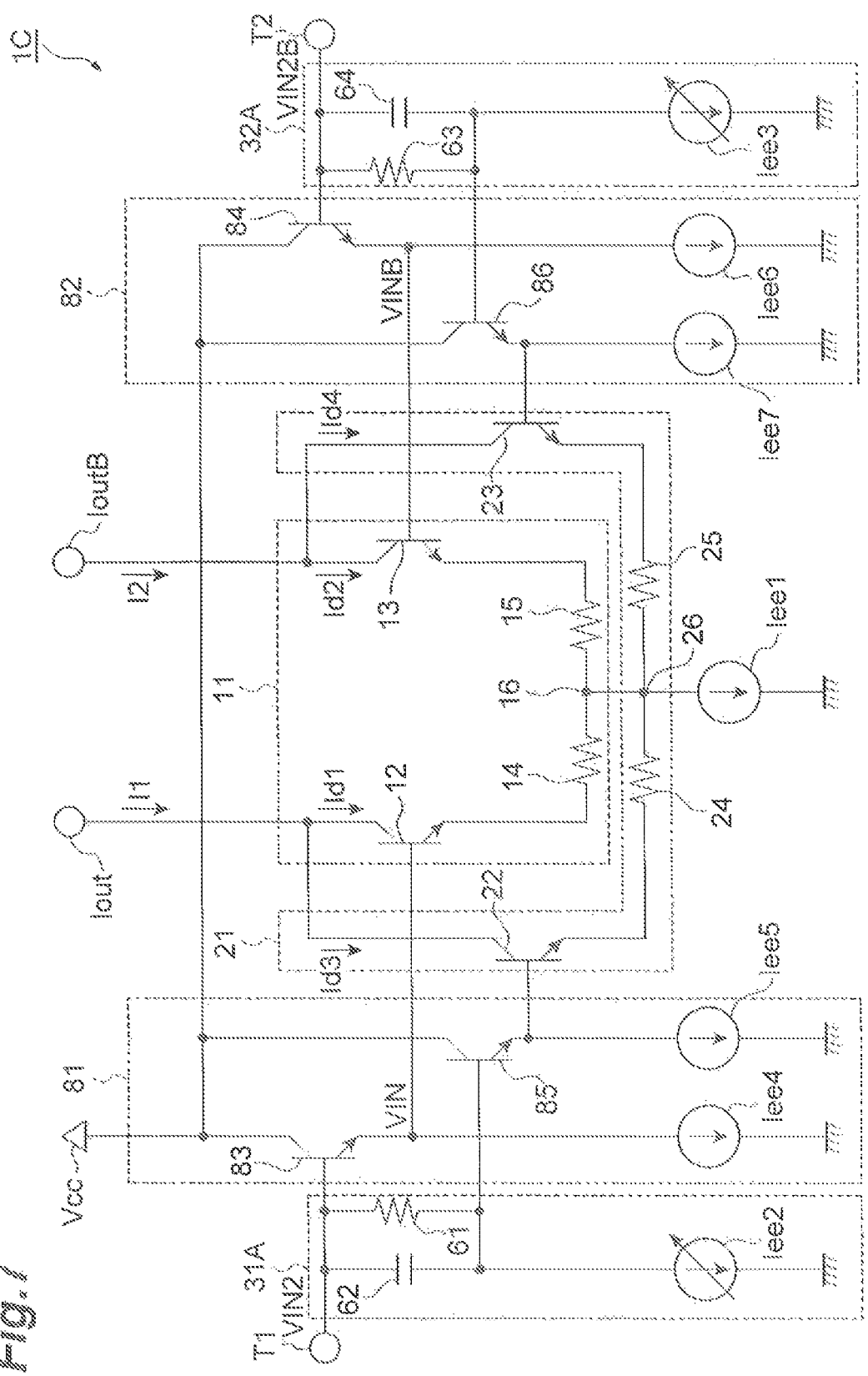
FIG. 7 is a circuit diagram of a differential amplifier according to a third modification.

FIG. 7 is a circuit diagram of a differential amplifier according to a third modification of the embodiment of the present invention. A differential amplifier 1C includes a first emitter follower 81 connected to the first voltage shifter 31A and a second emitter follower 82 connected to the second voltage shifter 32A, in addition to the structure of the differential amplifier 1A.

The first emitter follower 81 includes a fifth transistor 83, a seventh transistor 85, a current source Iee4, and a current source Iee5. A control terminal (base) of the fifth transistor 83 is connected to the terminal T1. One current terminal (emitter) of the fifth transistor 83 is connected to the control terminal (base) of the first transistor 12 and the current source Iee4. The other current terminal (collector) of the fifth transistor 83 is connected to the constant voltage line Vcc. A control terminal (base) of the seventh transistor 85 is connected to the terminal T1 through the first voltage shifter 31A. One current terminal (emitter) of the seventh transistor 85 is connected to the control terminal (base) of the third transistor 22 and the current source Iee5. The other current terminal (emitter) of the seventh transistor 85 is connected to the constant voltage line Vcc.

The second emitter follower 82 includes a sixth transistor 84, an eighth transistor 86, a current source Iee6, and a current source Iee7. A control terminal (base) of the sixth transistor 84 is connected to the terminal T2. One current terminal (emitter) of the sixth transistor 84 is connected to the control terminal (base) of the second transistor 13 and the current source Iee6. The other current terminal (collector) of the sixth transistor 84 is connected to the constant voltage line Vcc. A control terminal (base) of the eighth transistor 86 is connected to the terminal T2 through the second voltage shifter 32A. One current terminal (emitter) of the eighth transistor 86 is connected to the control terminal (base) of the fourth transistor 23 and the current source Iee7. The other current terminal (collector) of the eighth transistor 86 is connected to the constant voltage line Vcc.

The differential amplifier 1C according to the third modification described above achieves the same advantage as the second modification. In the differential amplifier 1C, no resistor exists between the first differential pair 11 and the first emitter follower 81, and between the second differential pair 21 and the first emitter follower 81. In addition, no resistor exists between the first differential pair 11 and the second emitter follower 82, and between the second differential pair 21 and the second emitter follower 82. Because the voltages output from the first emitter follower 81 and the second emitter follower 82 does not suffer dumping effects by resistors, the first differential pair 11 and the second differential pair 21 can work normally at a high speed. In addition, current consumption of the current sources Iee4 to Iee7 can be set very smaller than a current consumption of the current source Iee1. For example, even though output currents of the current sources Iee4 to Iee7 are respectively set to about ⅒ of an output current of the current source Iee1, the first emitter follower 81 and the second emitter follower 82 can work normally. Therefore, high performance can be realized while power consumption is suppressed from increasing.

(Second Embodiment)

Hereinafter, an example of an amplifier using a differential amplifier according to a second embodiment of the present invention will be described. In the description of the second embodiment, explanation overlapping the explanation of the first embodiment is omitted and a difference with the first embodiment is described. That is, the content described in the first embodiment may be appropriately used in the second embodiment in a technical range.

Figure 8:
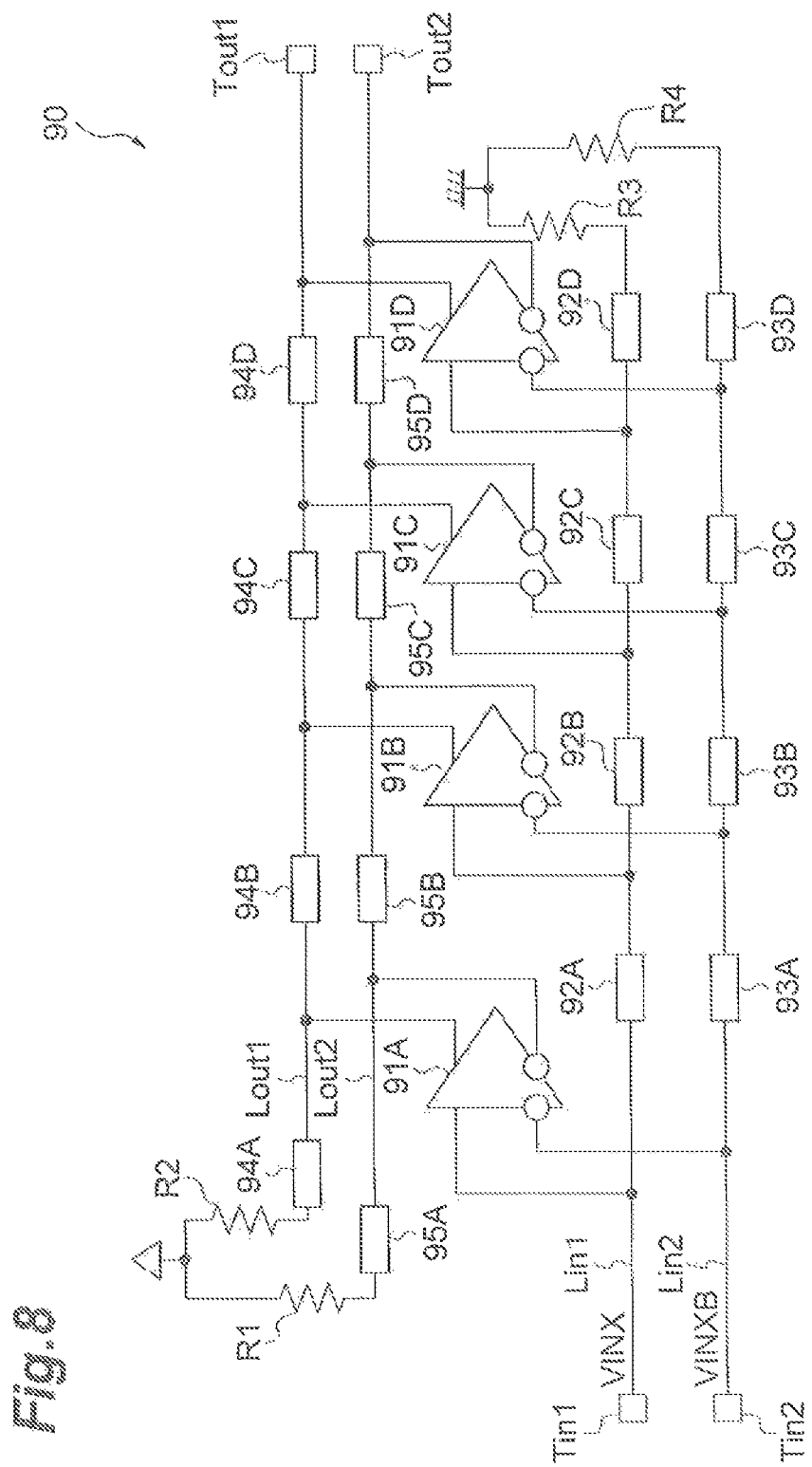
FIG. 8 is a circuit diagram of a travelling wave amplifier using a differential amplifier.

FIG. 8 is a circuit diagram of a Travelling Wave Amplifier (TWA) using the differential amplifier according to the embodiment. As illustrated in FIG. 8, a TWA 90 includes differential amplifiers 91A to 91D. In addition, the TWA 90 includes input transmission lines Lin1, Lin2 (delay lines Lin1, Lin2) and output transmission lines Lout1, Lout2 (delay lines Lout1, Lout2). The TWA 90 has the four differential amplifiers. However, the TWA 90 may have two or more differential amplifiers. In the TWA 90, delay times (to be described in detail below) of the input transmission lines Lin1 and Lin2 and the output transmission lines Lout1 and Lout2 are set according to the number of differential amplifiers. Each of the differential amplifiers 91A to 91D corresponds to any one of the differential amplifiers 1, 1A, 1B, and 1C according to the first embodiment and the first to third modifications.

An input terminal Tin1 is provided in an input end of the input transmission line Lin1. The input terminal Tin2 is provided in an input end of the input transmission line Lin2. For example, a positive-phase input signal VINX is input to the input terminal Tin1 from an outside. A negative-phase input signal VINXB is input to the input terminal Tin2 from the outside. The end opposite to the input end in the input transmission line Lin1 is grounded through a resistor R3, and the end opposite to the input end in the input transmission line Lin2 is grounded through a resistor R4.

An output terminal Tout1 is provided in an output end of the output transmission line Lout1. The output transmission line Lout1 is connected to a power supply line through a resistor R2 at the end opposite to the output end. In addition, an output terminal Tout2 is provided in an output end of the output transmission line Lout2. The output transmission line Lout2 is connected to a power supply line through a resistor R1 at the end opposite to the output end.

Each of the differential amplifiers 91A to 91D have a pair of input pins and a pair of output pins. At the input side, the input pins of the differential amplifiers 91A to 91D are connected to the input transmission lines Lin1, Lin2, and the differential amplifiers 91A to 91D receive input signals at different delay times. Specifically, a non-inverted input pin (terminal T1) of each of the differential amplifiers 91A to 91D is connected to the input transmission line Lin1, and an inverted input pin (terminal T2) of each of the differential amplifiers 91A to 91D is connected to the input transmission line Lin2.

At the output side, the output pins of the differential amplifiers 91A to 91D are connected to the output transmission lines Lout1, Lout2, and the differential amplifiers 91A to 91D receive output signals at different delay times. Specifically, a non-inverted output pin (positive-phase output current terminal Iout of FIG. 1) of each of the amplifiers 91A to 91D is connected to the output transmission line Lout1, and an inverted output pin (negative-phase output current terminal IoutB of FIG. 1) of each of the amplifiers 91A to 91D is connected to the output transmission line Lout2.

A positive-phase input voltage VIN (or VIN1 or VIN2) is input to the respective non-inverted input pins of the differential amplifiers 91A to 91D through the input transmission line Lin1. The differential amplifiers 91A to 91D output a positive-phase output signal (positive-phase output current I1) to the output transmission line Lout1 from the respective non-inverted output pins. In addition, a negative-phase input voltage VINB (or VIN1B or VIN2B) is input to the respective inverted input pins of the differential amplifiers 91A to 91D through the input transmission line Lin2. The differential amplifiers 91A to 91D output a negative-phase output signal (negative-phase output current I2) to the output transmission line Lout2 from the respective inverted output pins.

The positive-phase input signal input to the input terminal Tin1 is input to the differential amplifiers 91A to 91D at different delay times, respectively. The respective delay times of the signal input to the differential amplifiers 91A to 91D are determined corresponding to the length of the transmission line from the input terminal Tin1 to the respective differential amplifiers. Likewise, the negative-phase input signal input to the input terminal Tin2 is input to the differential amplifiers 91A to 91D at different delay times, respectively. The respective delay times of the signal input to the differential amplifiers 91A to 91D are determined corresponding to length of the transmission line from the input terminal Tin2 to the respective differential amplifiers. That is, delay times per unit length of the transmission lines are defined by $(LC)^{1/2}$. Here, L is an inductance component of the transmission line and C is a capacitance component of the transmission line.

A transmission line 92A illustrated in FIG. 8 is a part of the input transmission line Lin1 starting from a node having a branch to the non-inverted input pin of the differential amplifier 91A and ending at a node having a branch to the non-inverted input pin of the differential amplifier 91B. The transmission line 92A has an input capacitance of the differential amplifier 91B, a wiring capacitance, and a wiring inductance. A transmission line 93A is a part of the input transmission line Lin2 starting from a node having a branch to the inverted input pin of the differential amplifier 91A and ending at a node having a branch to the inverted input pin of the differential amplifier 91B. The transmission line 93A has an input capacitance of the differential amplifier 91B, a wiring capacitance, and a wiring inductance.

In addition, a transmission line 92B is a part of the input transmission line Lin starting from the node having the branch to the non-inverted input pin of the differential amplifier 91B and ending at a node having a branch to the non-inverted input pin of the differential amplifier 91C. The transmission line 92B has an input capacitance of the amplifier 91C, a wiring capacitance, and a wiring inductance. A transmission line 93B is a part of the input transmission line Lin2 starting from the node having the branch to the inverted input pin of the differential amplifier 91B and ending at a node having a branch to the inverted input pin of the differential amplifier 91C. The transmission line 93B has an input capacitance of the differential amplifier 91C, a wiring capacitance, and a wiring inductance.

In addition, a transmission line 92C is a part of the input transmission line Lin1 starting from the node having the branch to the non-inverted input pin of the differential amplifier 91C and ending at a node having a branch to the non-inverted input pin of the differential amplifier 91D. The transmission line 92C has an input capacitance of the differential amplifier 91D, a wiring capacitance, and a wiring inductance. A transmission line 93C is a part of the input transmission line Lin2 starting from the node having the branch to the inverted input pin of the differential amplifier 91C and ending at a node having a branch to the inverted input pin of the differential amplifier 91D. The transmission line 93C has an input capacitance of the differential amplifier 91D, a wiring capacitance, and a wiring inductance.

In addition, a transmission line 92D is a part of the input transmission line Lin1 starting from the node having the branch to the non-inverted input pin of the differential amplifier 91D and ending at one end of the resistor R3. The transmission line 92D has a wiring capacitance and a wiring inductance. A transmission line 93D is a part of the input transmission line Lin2 starting from the node having the branch to the inverted input pin of the differential amplifier 91D and ending at one end of the resistor R4. The transmission line 93D has a wiring capacitance and a wiring inductance.

In addition, a transmission line 94A is a part of the output transmission line Lout1 starting from one end of the resistor R2 and ending at a node having a branch to the non-inverted output pin of the differential amplifier 91A. The transmission line 94A has a wiring capacitance and a wiring inductance. A transmission line 95A is a part of the output transmission line Lout2 starting from one end of the resistor R1 and ending at a node having a branch to the inverted output pin of the differential amplifier 91A. The transmission line 95A has a wiring capacitance and a wiring inductance.

In addition, a transmission line 94B is a part of the output transmission line Lout1 starting from the node having the branch to the non-inverted output pin of the differential amplifier 91A and ending at a node having a branch to the non-inverted output pin of the differential amplifier 91B. The transmission line 94B has an output capacitance of the differential amplifier 91A, a wiring capacitance, and a wiring inductance. A transmission line 95B is a part of the output transmission line Lout2 starting from the node having the branch to the inverted output pin of the differential amplifier 91A and ending at a node having a branch to the inverted output pin of the differential amplifier 91B. The transmission line 95B has an output capacitance of the differential amplifier 91A, a wiring capacitance, and a wiring inductance.

A transmission line 94C is a transmission a part of the output transmission line Lout1 starting from the node having the branch to the non-inverted output pin of the differential amplifier 91B and ending at a node having a branch to the non-inverted output pin of the differential amplifier 91C. The transmission line 94C has an output capacitance of the differential amplifier 91B, a wiring capacitance, and a wiring inductance. A transmission line 95C is a part of the output transmission line Lout2 starting from the node having the branch to the inverted output pin of the differential amplifier 91B and ending at a node having a branch to the inverted output pin of the differential amplifier 91C. The transmission line 95C has an output capacitance of the differential amplifier 91B, a wiring capacitance, and a wiring inductance.

A transmission line 94D is a part of the output transmission line Lout1 starting from the node having the branch to the non-inverted output pin of the differential amplifier 91C and ending at a node having a branch to the non-inverted output pin of the differential amplifier 91D. The transmission line 94D has an output capacitance of the differential amplifier 91C, a wiring capacitance, and a wiring inductance. A transmission line 95D is a part of the output transmission line Lout2 starting from the node having the branch to the inverted output pin of the differential amplifier 91C and ending at a node having a branch to the inverted output pin of the differential amplifier 91D. The transmission line 95D has an output capacitance of the differential amplifier 91C, a wiring capacitance, and a wiring inductance.

In the TWA 90, the respective delay times provided by the transmission lines 92A, 93A, 94B, and 95B to the signals are set to be substantially equal to each other. Therefore, the signals that pass through the differential amplifiers 91A, 91B and reach at the output terminals Tout1, Tout2, respectively, have the delay times substantially equal to each other, so that the respective phases of the signals passing through the differential amplifiers 91A, 91B are matched with each other at the output terminals Tout1, Tout2. In addition, the respective delay times provided by the transmission lines 92B, 93B, 94C, and 95C to the signals are set to be substantially equal to each other. Therefore, the signals that pass through the differential amplifiers 91B, 91C and reach at the output terminals Tout1, Tout2, respectively, have the delay times substantially equal to each other so that the respective phases of the signals passing through the differential amplifiers 91B, 91C are matched with each other at the output terminals Tout1, Tout2. In addition, the respective delay times provided by the transmission lines 92C, 93C, 94D, and 95D to the signals are set to be substantially equal to each other. Therefore, the signals that pass through the amplifiers 91C, 91D and reach at the output terminals Tout1, Tout2, respectively, have the delay times substantially equal to each other, so that the phases of the signals output from the differential amplifiers 91C, 91D are matched with each other at the output terminals Tout1, Tout2. Accordingly, the respective current signals generated from the signal input to the input terminals Tin1 and Tin2 by the differential amplifiers 91A to 91D have the phases matched with each other at the output terminals Tout1 and Tout2.

The TWA 90 according to the second embodiment described above, on which the differential amplifiers 91A to 91D are mounted achieves the same advantage as the first embodiment. For example, when each of the differential amplifiers 91A to 91D corresponds to the differential amplifier 1B according to the second modification of the first embodiment, the same advantage as the second modification is achieved.

EXAMPLE

The present invention will be described in detail by the following example. However, the present invention is not limited to the example.

(Simulation Results of Total Harmonic Distortion)

In this example, total harmonic distortions for amplitudes of output current of differential amplifiers according to an example and a comparative example are calculated. The differential amplifier 1 illustrated in FIG. 1 is used as the differential amplifier according to the example and the differential amplifier 200 illustrated in FIG. 2 is used as the differential amplifier according to the comparative example. The total harmonic distortions of the output currents are calculated by inputting a sign-wave voltage signal of 1 GHz to the differential amplifiers 1 and 200 and performing transient analysis. Note that when the total harmonic distortion is small, a distortion of the output current is small.

Figure 9:
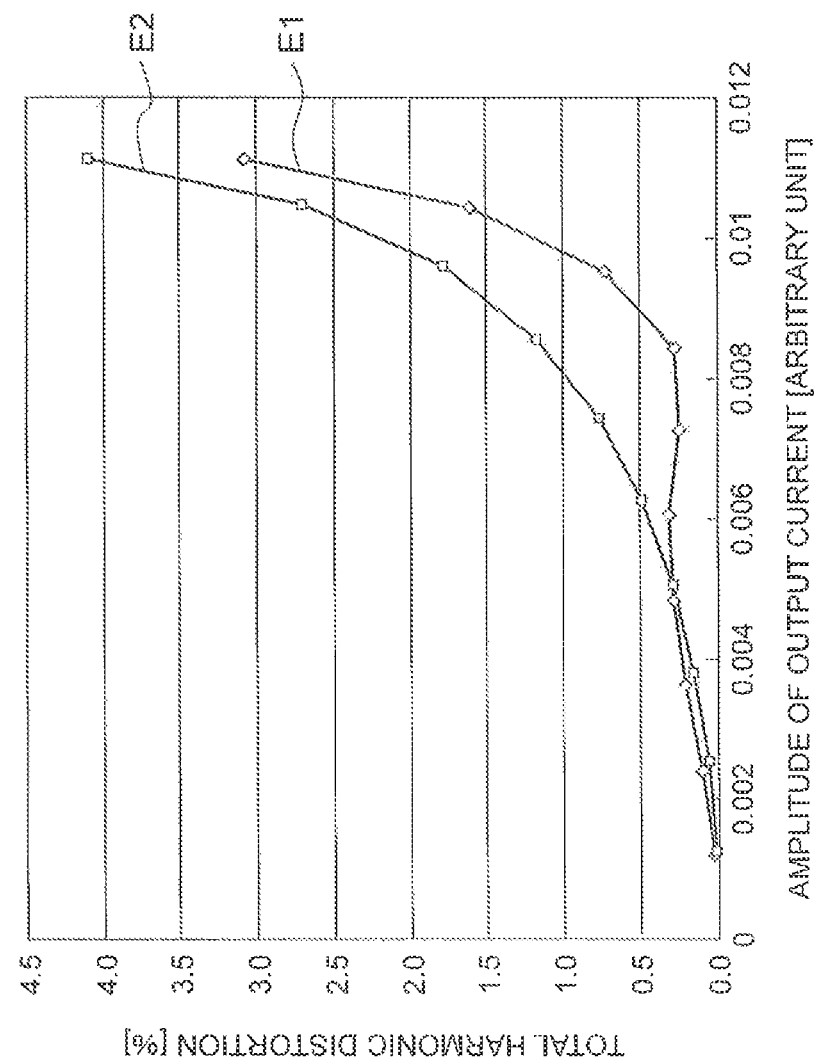
FIG. 9 is a diagram illustrating a relationship between total harmonic distortion and amplitude of an output current signal.

FIG. 9 is a diagram illustrating a relationship between total harmonic distortion and amplitude of an output current. In FIG. 9, a horizontal axis indicates the amplitude of the output current and a vertical axis indicates the total harmonic distortion of the output current. A curve E1 shows a calculation result of the differential amplifier 1 and a curve E2 shows a calculation result of the differential amplifier 200. As illustrated in FIG. 9, when the amplitudes of the output current output by the differential amplifiers 1 and 200 increase (that is, amplitudes of input voltage signals increase), the total harmonic distortion increases. In the case of amplitude of a high output current (for example, when the amplitude of the output current is 0.01), the total harmonic distortion of the differential amplifier 1 according to the example is lower than the total harmonic distortion of the differential amplifier 200 according to the comparative example.

Specifically, in the curve E2, the total harmonic distortion is 0.5% when the amplitude of the output current is about 0.006 and in the curve E1, the total harmonic distortion is 0.5% when the amplitude of the output current is about 0.009. In addition, in the curve E2, the total harmonic distortion is 1.0% when the amplitude of the output current is about 0.008 and in the curve E1, the total harmonic distortion is 1.0% when the amplitude of the output current is about 0.01. When the amplitude of the output current is about 0.01, the total harmonic distortion of the curve E1 is suppressed to about 60% of the total harmonic distortion of the curve E2. Therefore, when target total harmonic distortion is less than 1.0%, the differential amplifier 1 according to the example can increase the amplitude of the output current as compared with the differential amplifier 200 according to the comparative example.

The differential amplifier according to the present invention is not limited to the embodiments described above and various modifications can be made. For example, the first and second embodiments may be appropriately combined with the first to third modifications.

The first to eighth transistors described in the embodiments and the modifications may be PNP-type bipolar transistors, N-channel FETs, or P-channel FETs. In addition, the first to fourth resistors described in the embodiments and the modifications may not necessarily be provided.

What is claimed is:

1. A differential amplifier for generating a differential output current from a differential input voltage, comprising:
   a pair of input terminals configured to externally receive the differential input voltage;
   a first differential pair including a first transistor, a second transistor, a first resistor, and a second resistor, the first transistor and the second transistor each having a first current terminal connected to each other through the first resistor and the second resistor connected in series to the first resistor, the first differential pair being configured to generate a first differential signal in response to the differential input voltage;
   a pair of level shifters configured to generate a shifted differential voltage shifted from the differential input voltage;
   a second differential pair including a third transistor, a fourth transistor, a third resistor, and a fourth resistor, the third transistor and the fourth transistor each having a first current terminal thereof connected to each other through the third resistor and the fourth resistor connected in series to the third resistor, the second differential pair being configured to generate a second differential signal in response to the shifted differential voltage;
   a current source configured to provide a constant current to the first and second differential pairs; and
   a pair of output terminals configured to externally output the differential output current containing the first differential signal and the second differential signal.

2. The differential amplifier according to claim 1,
   wherein each of the level shifters includes a shifting current source and a shifting resistor, and, in each level shifter, the shifting current source is configured to provide a shifting current to the shifting resistor to cause a voltage drop equal to a product of the shifting current and a resistance of the shifting resistor, and
   wherein each of the level shifters shifts the differential input voltage to the shifted differential voltage by the voltage drop.

3. The differential amplifier according to claim 2,
   wherein each of the level shifters further includes a shifting capacitor connected in parallel to the shifting resistor.

4. The differential amplifier according to claim 2,
   wherein the differential input voltage is constituted by a positive-phase input voltage and a negative-phase input voltage having a phase opposite a phase of the positive-phase input voltage, the positive-phase input voltage being fed to a control terminal of the first transistor, the negative-phase input voltage being fed to a control terminal of the second transistor, and
   wherein the shifted differential voltage is constituted by a positive-phase shifted voltage and a negative-phase shifted voltage, the positive-phase shifted voltage having an average lower than an average of the positive-phase input voltage by the voltage drop and the negative-phase shifted voltage having an average lower than an average of the negative-phase input voltage by the voltage drop, the positive phase shifted voltage being fed to a control terminal of the third transistor, the negative-phase shifted voltage being fed to a control terminal of the fourth transistor.

5. The differential amplifier according to claim 2,
   wherein each of the level shifters further includes an input terminal and an output terminal, and, in each level shifter, the input terminal is connected to one end of the shifting resistor, and the output terminal is connected to the other end of the shifting resistor and one end of the shifting current source, and
   wherein the other end of each shifting current source is grounded.

6. The differential amplifier according to claim 5,
   wherein one of the pair of input terminals is connected to the input terminal of one of the level shifters and a control terminal of the first transistor,
   wherein the other of the pair of input terminals is connected to the input terminal of the other of the level shifters and a control terminal of the second transistor,
   wherein the output terminal of said one of the level shifters is connected to a control terminal of the third transistor, and
   wherein the output terminal of said other of the level shifters is connected to a control terminal of the fourth transistor.

7. The differential amplifier according to claim 5,
   further including a fifth transistor and a sixth transistor, the fifth transistor having a control terminal connected to one of the pair of input terminals and a first current terminal connected to the input terminal of one of the level shifters, the sixth transistor having a control terminal connected to the other of the pair of input terminals and a first current terminal connected to the input terminal of the other of the level shifters, and
   wherein the fifth and sixth transistors each have second current terminals commonly connected to a power line.

8. The differential amplifier according to claim 5,
   further including a fifth transistor, a sixth transistor, a seventh transistor, and an eighth transistor each having a control terminal, a first current terminal, and second current terminal,
   wherein one of the pair of input terminals is connected to the control terminal of the fifth transistor and the input terminal of one of the level shifters,
   wherein the other of the pair of input terminals is connected to the control terminal of the sixth transistor and the input terminal of the other of the level shifters,
   wherein the first current terminal of the fifth transistor is connected to a control terminal of the first transistor,
   wherein the first current terminal of the sixth transistor is connected to a control terminal of the second transistor,
   wherein the output terminal of said one of the level shifters is connected to a control terminal of the seventh transistor,
   wherein the output terminal of said other of the level shifters is connected to a control terminal of the eighth transistor,
   wherein the first current terminal of the seventh transistor is connected to a control terminal of the third transistor,
   wherein the first current terminal of the eighth transistor is connected to a control terminal of the fourth transistor, and
   wherein the respective second current terminals of the fifth, sixth, seventh, and eighth transistors are connected to a power line.

9. The differential amplifier according to claim 1,
   wherein the first current terminal of the first transistor is connected to one end of the first resistor,
   wherein the first current terminal of the second transistor is connected to one end of the second resistor,
   wherein the first current terminal of the third transistor is connected to one end of the third resistor,
   wherein the first current terminal of the fourth transistor is connected to one end of the fourth resistor, and wherein the other end of each of the first, second, third, and fourth resistors is connected to one end of the current source.

10. An optical modulator driver for generating a driving signal from a differential input signal, comprising:
- a pair of input transmission lines configured to externally receive the differential input signal at a pair of ends of the input transmission lines and configured to transmit the differential input signal;
- differential amplifiers each comprising,
- a pair of input terminals configured to receive the differential input signal;
- a first differential pair including a first transistor, a second transistor, a first resistor, and a second resistor, the first transistor and the second transistor each having a first current terminal connected to each other through the first resistor and the second resistor connected in series to the first transistor, the first differential pair being configured to generate a first differential signal in response to the differential input signal;
- a pair of level shifters configured to generate a shifted differential voltage shifted from the differential input signal;
- a second differential pair including a third transistor, a fourth transistor, a third resistor, and a fourth resistor, the third transistor and the fourth transistor each having a first current terminal thereof connected to each other through the third resistor and the fourth resistor connected in series to the third resistor, the differential pair being configured to generate a second differential signal in response to the shifted differential voltage;
- a current source configured to provide a constant current to the first and second differential pairs; and
- a pair of output terminals configured to output a differential output signal containing the first differential signal and the second differential signal; and
- a pair of output transmission lines configured to receive the differential output signals output from the pair of output terminals of each of the differential amplifiers and output the driving signal at a pair of ends of the output transmission lines as a sum of the differential output signals.

* * * * *